United States Patent [19]

Dingwall

[11] 4,063,274
[45] Dec. 13, 1977

[54] INTEGRATED CIRCUIT DEVICE INCLUDING BOTH N-CHANNEL AND P-CHANNEL INSULATED GATE FIELD EFFECT TRANSISTORS

[75] Inventor: Andrew Gordon Francis Dingwall, Bridgewater, N.J.

[73] Assignee: RCA Corporation, New York, N.Y.

[21] Appl. No.: 749,255

[22] Filed: Dec. 10, 1976

[51] Int. Cl.$^2$ ............................................. H01L 29/40
[52] U.S. Cl. ........................................ 357/53; 357/42; 357/52; 357/68; 357/86; 357/89
[58] Field of Search ....................... 357/52, 53, 41, 42, 357/68, 86, 89, 48

[56] References Cited

U.S. PATENT DOCUMENTS

| | | | |
|---|---|---|---|
| 3,491,273 | 1/1970 | Stiegler | 357/53 |
| 3,763,406 | 10/1973 | Bosselaar | 357/53 |
| 3,798,512 | 3/1974 | Critchlow et al. | 357/52 |
| 3,845,549 | 10/1974 | Cauge et al. | 357/53 |
| 3,911,473 | 10/1975 | Nienhuis | 357/52 |

OTHER PUBLICATIONS

L. Rosier, "Surface State and Surface Recombination Velocity Characteristics of Si–SiO$_2$ Interfaces," IEEE Trans. on Elec. Dev., vol. Ed.–13 No. 12, Feb. 1966, pp. 260–268.

Primary Examiner—Edward J. Wojciechowicz
Assistant Examiner—Joseph E. Clawson, Jr.
Attorney, Agent, or Firm—H. Christoffersen; R. P. Williams; Sanford J. Asman

[57] ABSTRACT

A complementary integrated circuit device, adapted for fabrication with relatively high circuit density, includes relatively fast transistors with a closed gate geometry. Permanently-off gates surround transistors to isolate them from other transistors.

7 Claims, 10 Drawing Figures

INTEGRATED CIRCUIT DEVICE INCLUDING BOTH N-CHANNEL AND P-CHANNEL INSULATED GATE FIELD EFFECT TRANSISTORS

The present invention relates to U.S. Patent Application Ser. No. 749,410, filed Dec. 10, 1976 [RCA 66,383A], filed [concurrently herewith], in which the Applicant is A. G. F. Dingwall and which application is assigned to the RCA Corporation. That application is a continuation-in-part of U.S. patent application Ser. No. 585,874 now abandoned, filed June 11, 1975.

This invention relates to integrated circuit devices of the type which include insulated gate field effect transistors (IGFETs) as active elements therein. The invention is a novel structure for a complementary insulated gate field effect integrated circuit device.

In one known form, complementary IGFET integrated circuit devices are made from a substrate body of semiconductive material, usually silicon of N type conductivity, which has a principal surface. Well regions of P type conductivity are formed adjacent to this surface in localized portions of the substrate body. N-channel transistors are fabricated within the boundaries of the well regions and P-channel transistors are formed outside the well regions.

Each transistor in such known structures comprises a source region and a drain region spaced apart by a channel region. Transistors often are isolated from the leakage effects of undesired surface inversion by means of so-called guard bands, one of which surrounds each transistor which must be isolated. Because of breakdown effects, space must be left between each guard band and the transistor which it surrounds and space must be left outside the guard bands between adjacent guard bands. The result of these spacings is that substantial silicon "real estate" is required for each transistor. A need has existed for a structure which can provide higher circuit component density than has previously been available.

An important feature of the present novel device is a closed geometry for the transistors thereof. Each transistor in the present device comprises a relatively small drain region surrounded by a frame-like gate structure, which is preferably of the self-aligned type. The source of each transistor is a region which surrounds the frame-like gate structure. In discrete transistor form, devices having this geometry have been known for some time. See for example, U.S. Pat. No. 3,315,096 issued to Carlson et al. on Apr. 18, 1967. Integrated circuit devices are also known in which transistors having closed geometries have been employed, as described for example in U.S. Pat. No. 3,608,189 issued to Gray on Sept. 28, 1971, and U.S. Pat. No. 3,868,721 issued to Davidsohn on Feb. 25, 1975. For high frequency or fast applications, the closed geometry is superior to an open or linear geometry because it provides a transistor having a relatively low drain-to-substrate capacitance, a parameter which has limited the speed of known open-geometry insulated gate field-effect transistors.

Figure 1:
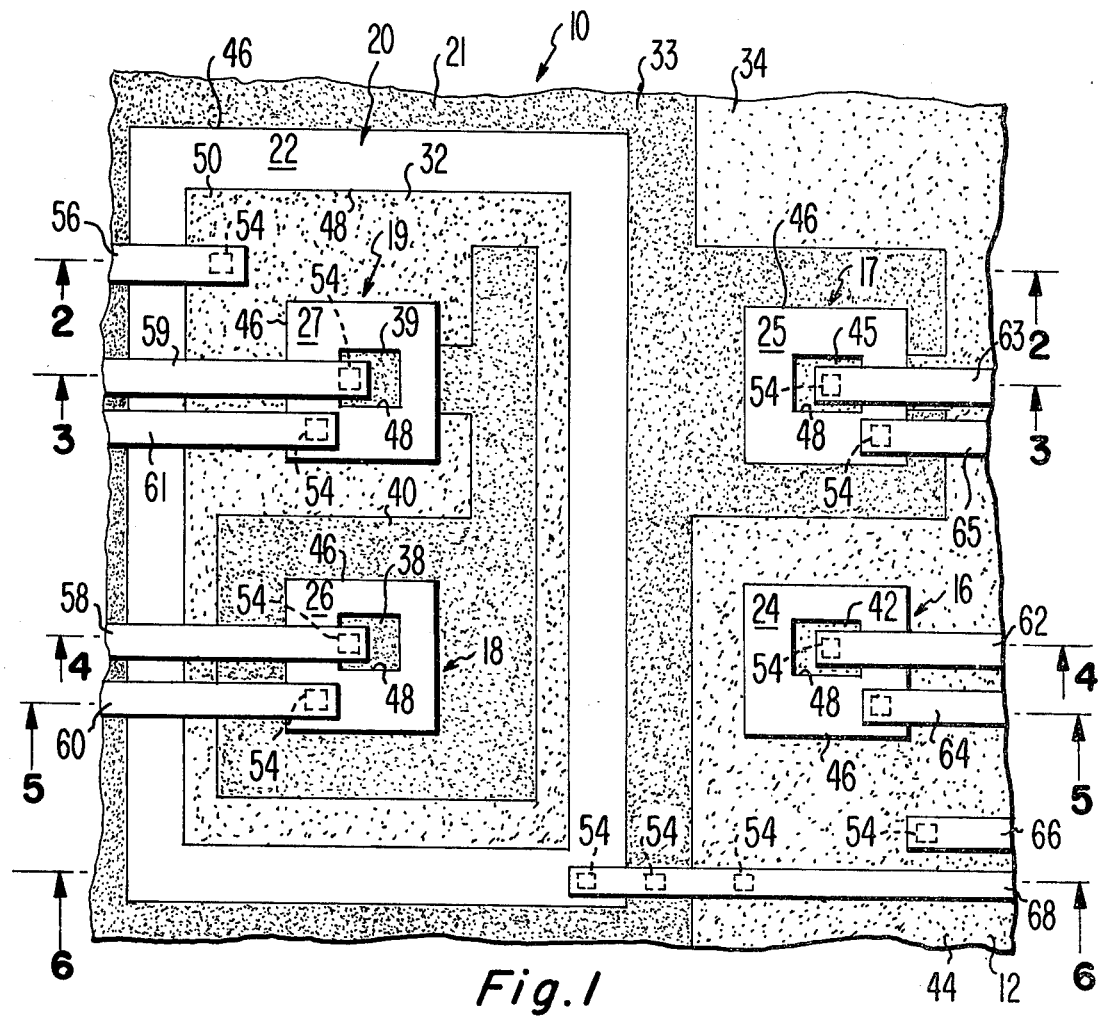
FIG. 1 is a plan view of a portion of an integrated circuit device, illustrating the construction of one N-channel and one P-channel insulated gate field effect transistor therein.
Figure 2:
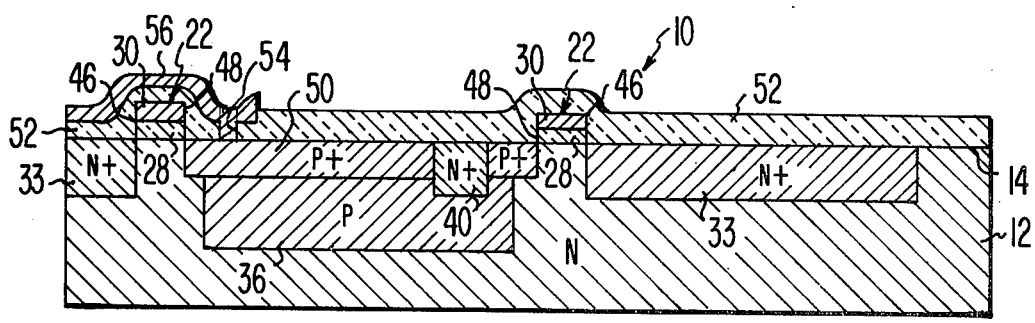
FIG. 2 is a cross-section taken along the line 2—2 of FIG. 1.
Figure 3:
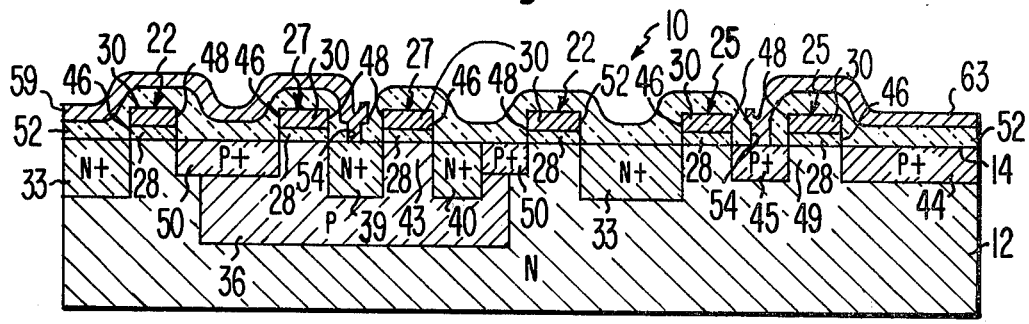
FIG. 3 is a cross-section taken along the line 3—3 of FIG. 1.

A portion of an integrated device 10 of the complementary IGFET type having the features of the present invention is illustrated in FIG. 1. The device 10 comprises a body 12 of semiconductive material such as silicon, which is initially of one type conductivity (N type in this example) and which has a surface 14 (See FIGS. 2, 3, 4, and 5). In this example, the body 12 is a bulk silicon body, but other forms of semiconductor material may also be used. For example, the body 12 may be an epitaxial layer on an insulating substrate, in the so-called silicon-on-sapphire technology.

Means including the body 12, that is, source, drain and channel regions in the body 12 and gate electrode means on the surface 14, define two P channel IGFETs 16, 17 and two N channel IGFETs 18, 19 together with means 20, 21 for isolating the P channel transistors 16, 17 from the N channel transistors 18, 19. These various means comprise a first frame-like structure 22, hereafter called a field shield, and other frame-like structures 24, 25, 26, 27 each hereafter called an active gate. Each of these gate structures includes a layer 28 (FIGS. 2 to 5) of insulating material and a layer 30 of conductive material on the layer 28 of insulating material. Although the layers 28 and 30 in any one gate structure are separate from the corresponding layers in each of the other frame-like structures, the same reference numeral is applied to each of the respective insulating and conductive layers for convenience.

The field shield 22 and each of the gate structures 24, 25, 26, and 27 has a closed geometry. By this is meant that the field shield 22 and the gate structures 24, 25, 26 and 27 have the configuration of a closed pattern which has an opening therein. While rectangular structures are shown, any suitable topologically closed shape may be adopted. The rectangular shape is preferred, for its adaptability to integrated circuit structures of relatively high packing density.

The field shield 22 surrounds a first portion 32 of the surface 14 and is surrounded by a guard band 33 and second portion 34 of the surface 14. The active gates 26, 27 are disposed on the first portion 32 of the surface 14 and the active gates 24, 25 are disposed on the second portion 34 of the surface 14. As shown in FIG. 1, the field shield 22 may be much larger than the active gates 26, 27 so that other frame-like gate structures like the active gates 26, 27 may be disposed on the first portion 32 of the surface 14.

A well region 36 of conductivity type opposite to that of the body 12, P type in this example, is in the body 12 adjacent to the first portion 32 of the surface 14. Regions 38, 39 of N+ type conductivity are within the P well region 36 adjacent to parts of the surface 14 which are surrounded by the active gates 26, 27, respectively. Another region 40 of N+ type conductivity is within the P well region 36 adjacent to a part of the surface 14 which surrounds the active gate 26 and a portion of the active gate 27. The regions 38 and 40 define the ends of a channel zone 41 for the transistor 18, and the regions 39 and 40 define the ends of a channel zone 43 for the transistor 19.

Regions 42, 45 of P+ type conductivity are in the body 12 adjacent to parts of the surface 14 which are surrounded by the active gates 24, 25 and another region 44 of P+ type conductivity is in the body 12 adjacent to a part of the surface 14 which surrounds the active gates 24, 25. The regions 42 and 44 define the ends of a channel zone 47 for the transistor 16, and the regions 45 and 44 define the ends of a channel zone 49 for the transistor 17.

Owing to the process which is used to make the device 10, which process involves self-aligned gate techniques like those disclosed in U.S. Pat. No. 3,475,234 issued Oct. 28, 1969 to Kerwin et al., each of the field shield 22 and the gate structures 24, 25, 26, and 27 has an inner peripheral boundary and an outer peripheral boundary. For convenience, the outer peripheral boundaries of the gate structures are each designated by the reference numeral 46 and the inner peripheral boundaries are designated by the reference numeral 48. Each of the regions 32, 33, 38, 39, 42, and 45 has a surface-intercept boundary substantially contiguous with one or the other of an inner or an outer peripheral boundary of a gate structure.

Means including a part of the first portion 32 of the surface 14 is provided for establishing ohmic contact to the well region 36. In this example, this means includes a well contact region 50 of P+ type conductivity, of doping density higher than the doping density in the well region 36. The region 50 includes part of the first portion 32 of the surface 14 which lies between the guard gate 22 and the active gates 26, 27. In this example, the region 50 surrounds the region 40, surrounds the active gate 26, but does not fully surround the active gate 27.

An insulating coating 52 overlies substantially all of the surface of the device 10 and has apertures 54 therein for permitting contact to be made to the various regions and conductive layers. The layer 52 may be composed of, for example, a chemical vapor deposited glass.

A source-substrate conductor 56 has a portion thereof extending through an opening 54 into contact with the P+ type region 50. Drain conductors 58, 59 have portions thereof extending through openings 54 into contact with the regions 38, 39, respectively. A gate conductor 60 extends through an opening 54 into contact with the conductive layer 30 of the active gates 26, and a gate conductor 61 contacts the active gate 27. Drain conductors 62, 63 extend into contact with the regions 42, 45 in the transistors 16, 17, respectively. A gate conductor 64 extends into contact with the conductive layer 30 of the active gate 24, and a gate conductor 65 contacts the active gate 25. A source conductor 66 extends into contact with the region 44.

The field shield 22 and the guard band 33 provide means for isolating the P-channel transistors 16, 17 from the N-channel transistors 18, 19. In the operation of the device 10, the guard band 33, the field shield 22, and the P+ source plane 44 are all connected together and to the positive power supply, $V_{DD}$. The connection is made through a power connector 68, which electrically contacts the conductive layer 30 of the field shield 22, the N+ guard band 33, and the P+ source plane 44 through openings 54 in the oxide layer 52. While the guard band 33 alone could provide isolation between the P-channel transistors 16, 17 and the N-channel transistors, the field shield 22 insures that even if there is any break in the guard band created during manufacture, the field shield 22 will act as the gate of a P-channel transistor which is permanenly biased off.

The guard band 33 is also used to provide low transconductance P-channel transistors, such as transistor 17, while the P+ well contact region 30 is used to provide low transconductance N-channel transistors, such as transistor 19. These transistors 17, 19 are each substantially surrounded by either the guard band 33 or the well contact region 50, so that they have relatively narrow channel zones 43, 49.

Other uses for the N+ guard band 33 are to provide a contact to the N type substrate 12 and to prevent latch-ups which might otherwise result if the bias on the field shield 22 did not cut off current flow under the field shield 22 prior to the onset of current flow in other portions of the integrated circuit. While the exact mechanism which causes such latch-ups to occur is not well known, it might result either from the lower conductivity of polycrystalline silicon, which is used for the conductive layer 30 of the field shield 22, as compared to metals, causing a delay in the effectiveness of the field shield 22, or from transients in the power supply voltage. In any event, it has been found that with a field shield 22 as well as a guard band 22, latch-up does not occur, and it is not necessary to place constraints upon the circuit designer utilizing the device 10.

The several conductors shown in FIGS. 1 to 6 do not interconnect the transistors 16, 17, 18, 19 together to perform any circuit function, inasmuch as the structure described here is generally applicable to many different circuit configurations. Modifications of the structure thus far described and examples of the ways in which the modified structures may be connected in certain circuit configurations will be obvious to those skilled in the art.

FIGS. 7 to 10 illustrate one embodiment of the method of manufacturing the present invention, particularly the application of the method to a bulk semiconductor body. For convenience, the cross-sections of FIGS. 7 to 10 show only the configuration in the plane of the cross-section.

In this example, the process begins with a semiconductor body 12 of silicon of N type conductivity which has a surface 14. The first step in the present process is to grow an oxide layer 69 on the surface 14. Preferably, this step is accomplished by heating the body 12 to a temperature of about 1100° C in an atmosphere of steam for a time sufficient to grow the oxide layer 69 to a thickness of approximately 6,000A.

Figure 7:
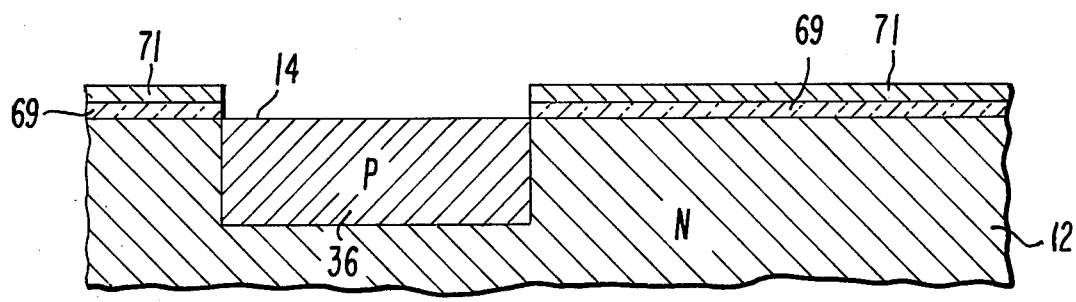
FIGS. 7–10 are a series of cross-sections illustrating the method of manufacturing the invention.

Referring to FIG. 7, a layer of photoresist material 71 is applied over the oxide layer 69. The photoresist layer 71 is defined using a first photomask, and then the photoresist is developed to expose portions of the oxide layer 69. Next, the exposed portions of the oxide layer 69 are etched away to expose portions of the surface 14. The body 12 is then placed in an ion implantation reactor and boron is implanted into the body 12. The implanted boron is diffused into the body 12 in a furnace heated to about 1200° C for about 16 hours in order to form the P well 36 which has a final concentration of about $2 \times 10^{16}$ atoms of boron/cc.

Next, the balance of the photoresist layer 71 and the oxide layer 69 are stripped exposing the surface 14. A gate oxide layer 28 is then grown on the surface 14. Preferably, this step is accomplished by heating the body 12 to a temperature of 875° C in an atmosphere of steam and a small quantity of HCl gas for a time sufficient to grow the oxide layer 28 to a thickness of approximately 1000A.

Figure 8:
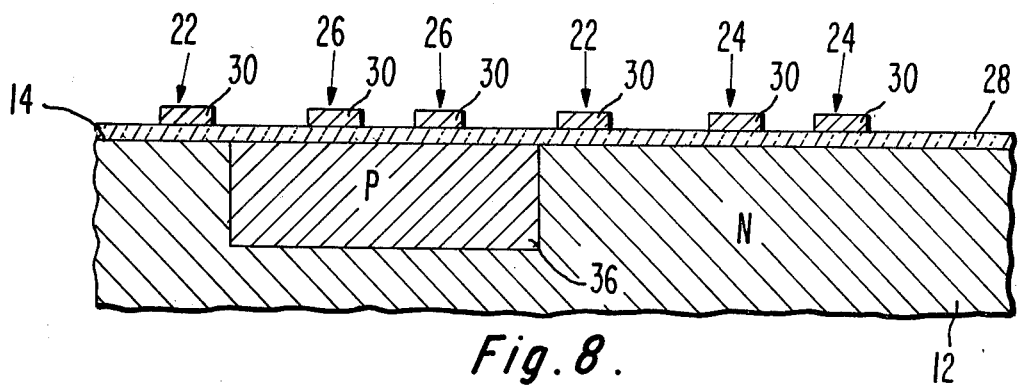

After the completion of the growth of the oxide layer 28 the body 12 is placed in a deposition reactor and a layer 30 of conductive material, preferably polysilicon, is deposited thereon. Any known deposition reaction may be employed, such as the thermal decomposition of silane (SiH$_4$). The process is carried out for a time sufficient to grow the layer 30 to a thickness of approximately 3500A. Using a conventional photolithographic technique involving a second photomask, the layer 30 is next defined into the pattern of the field shield structure 22 and the frame-like polysilicon gate structures 24, 26 are etched. The etch may take place in a plasma reactor containing a small amount of freon gas and nitrogen, and then the remaining photoresist is stripped, as shown in FIG. 8.

Figure 9:
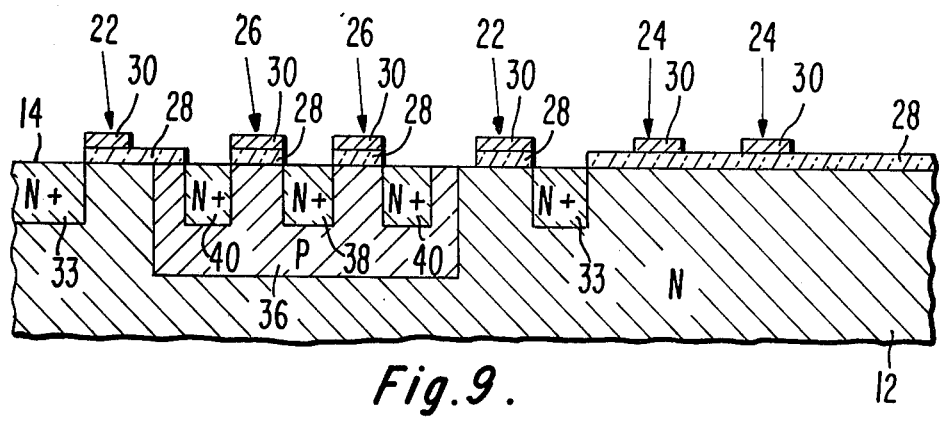

A new layer of photoresist is then applied over the surface 14 of the wafer and a third photomask is used to define areas where N+ regions will be formed. The photoresist is developed and the exposed portions of the gate oxide layer 28 are removed by etching to expose the surface 14 of the wafer. Then, the balance of the photoresist is removed, exposing the remaining polysilicon gates. The wafer is then placed in a diffusion furnace containing phosphorus oxychloride dopant for about 5 to 8 minutes at 1050° C in order to form N+ regions 33, 38 and 40 as shown in FIG. 9 and to dope the polysilicon material 30 thereby making it conductive.

Figure 10:
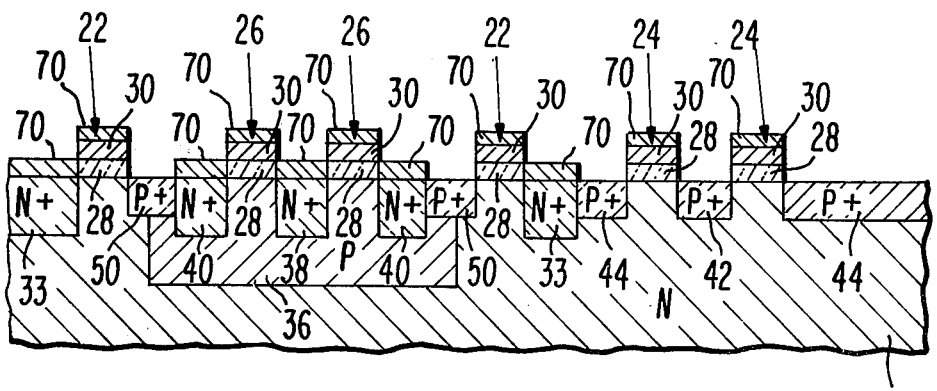

The balance of the exposed oxide 28 is then etched using the polysilicon areas 30 as a mask. Then, the wafer is placed in a furnace to grow a thermal oxide on the exposed surfaces. Oxides over N+ doped silicon grow faster than oxides over lightly doped silicon. Accordingly, in the time it takes to grow thermal oxide having a thickness of 900A over the lightly doped areas, an oxide having a thickness of about 2500A is grown over the N+ doped areas. Referring to FIG. 10, the oxide is then etched to remove the thinner portions leaving a residual oxide 70 over the N+ doped areas and the polysilicon as shown. The wafer is then placed in a diffusion furnace heated to about 1000° C and subjected to a boron nitride diffusion for approximately 20 minutes to form P+ regions 42, 44, 50. The P+ diffusion is of a lower concentration than the N+ diffusion, and consequently the N+ doped polysilicon regions 30 remain N+ doped.

Figure 4:
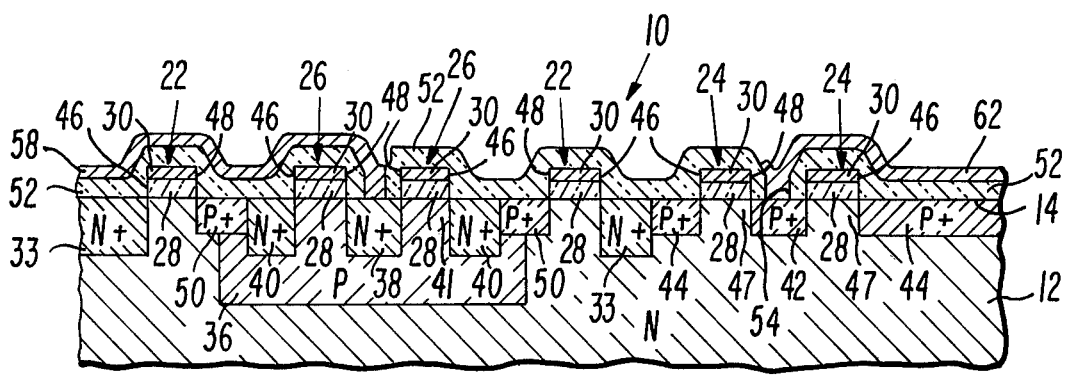
FIG. 4 is another cross-section taken along the line 4—4 of FIG. 1.
Figure 5:
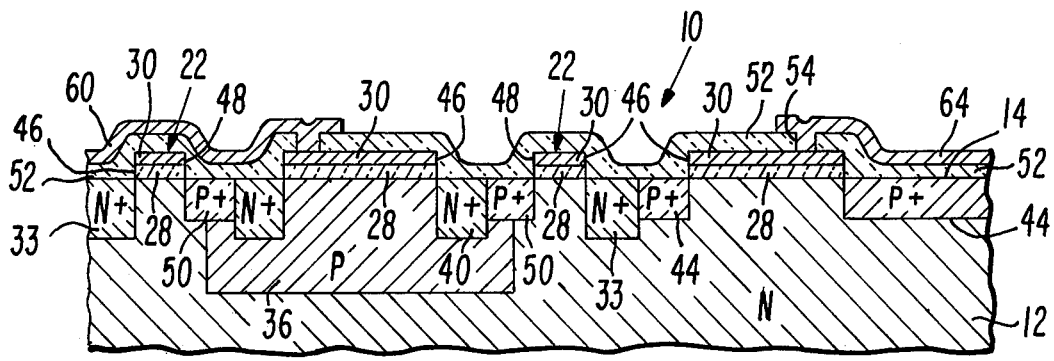
FIG. 5 is a partial cross-section taken along the line 5—5 of FIG. 1.
Figure 6:
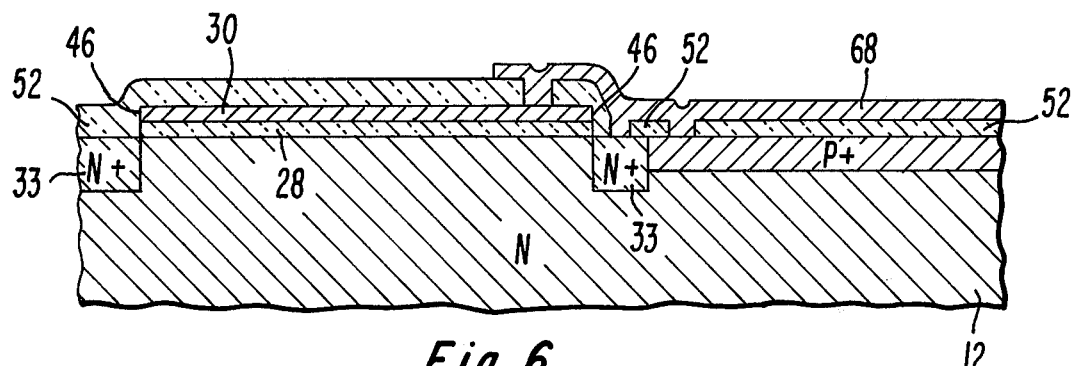
FIG. 6 is a partial cross-section taken along the line 6—6 of FIG. 1.

Following the P+ diffusion the remaining portions of the residual oxide 70 which are not protected by polysilicon layers 30 are removed by etching as is the residual oxide over the polysilicon layers 30. Then, the field oxide 52 is deposited and thermally grown to about 600A and then covered with deposited oxide to a thickness of about 6000A as shown in FIG. 4. Using a photoresist layer and a fourth photomask the field oxide is defined to form contact openings 54, which are then etched.

Next, a layer of a metal, such as aluminum, is evaporated over the surface of the field oxide 52. Using a fifth photomask the metal is defined to form contacts, such as contacts 58 and 62 shown in FIG. 4. Finally, a protective bond pad oxide about 10,000A thick is formed over the surface of the entire wafer, and bond pad openings are formed in the protective oxide. The formation of the protective oxide and the bond pad openings are well known in the art and are not shown in the figures.

The structure and method disclosed herein have several advantages over known CMOS technology. The device utilizes a single guard band 33 for isolating N channel from P channel devices and therefore does not require the guard band spacings of prior devices. The construction of the transistors in the closed geometry form has the benefit of providing very high transconductance transistors, while allowing for the formation of low transconductance transistors such as transistors 17 and 19.

What is claimed is:

1. An integrated circuit device comprising:
   a. a body of semiconductor material predominantly of one conductivity type, said body having a surface;
   b. a field shield comprising a first frame-like structure including a layer of insulating material on said surface and a layer of conductive material on said layer of insulating material, said field shield having a closed geometry which encloses a first portion of said surface and separates said first portion of said surface from a second portion of said surface;
   c. a well region having a conductivity type opposite that of said body, said well region extending into said body only from said first portion of said surface;
   d. a well contact for making ohmic contact to said well region, said well contact being totally within the region surrounded by said first frame-like structure including a part of said first portion of said surface;
   e. at least one semiconductor device extending into said well region from said first portion of said surface, said semiconductor device comprising:
      i. a second frame-like structure including a layer of insulating material on said first portion of said surface and a layer of conductive material on said layer of insulating material, said second frame-like structure having a closed geometry separating an outer portion of said first portion of said surface from an inner portion of said first portion of said surface;
      ii. a first region of the same conductivity type as said body extending into said well region from said inner portion of said first portion of said surface, said first region being surrounded by said second frame-like structure;
      iii. a second region of the same conductivity type as said body extending into said well region from said outer portion of said first portion of said surface, said second region surrounding said second frame-like structure;
   f. a substrate contact for making ohmic contact to said body comprising a guard band immediately surrounding said first frame-like structure, said guard band being of the same conductivity as said body and having a higher conductivity than said body;
   g. at least one semiconductor device extending into said body from that part of said second portion of said surface lying outside of said guard band, said semiconductor device comprising:
      i. a third frame-like structure including a layer of insulating material on said second portion of said surface and a layer of conductive material on said layer of insulating material, said third frame-like structure having a closed geometry separating an outer portion of said second portion of said surface from an inner portion of said second portion of said surface, ii. a third region of opposite conductivity type to said body extending into said body from said inner portion of said second portion of said surface, said third region being surrounded by said third frame-like structure;

iii. a fourth region of opposite conductivity type to said body extending into said body from said outer portion of said second portion of said surface, said fourth region surrounding said third frame-like structure.

2. The integrated circuit device of claim 1 wherein said means for making ohmic contact to said well region includes a contact region of the same conductivity type as said well region and of higher doping density than said well region adjacent to a part of said first portion of said surface which lies between said first frame-like structure and said second frame-like structure.

3. The integrated circuit device of claim 2 wherein said well contact is immediately within said field shield and said substrate contact immediately surrounds said field shield.

4. The integrated circuit device of claim 1 in which said substrate contact immediately surrounds a portion of said third frame-like structure.

5. The integrated circuit device of claim 1 in which said well contact immediately surrounds a portion of said second frame-like structure.

6. The integrated circuit device of claim 1 further comprising means for electrically connecting said substrate contact to said field shield.

7. The integrated circuit device of claim 6 further comprising means for electrically connecting said substrate contact to a power supply.

* * * * *